United States Patent [19]

McGuire et al.

[11] Patent Number: 5,373,238

[45] Date of Patent: Dec. 13, 1994

[54] FOUR LAYER MAGNETORESISTANCE DEVICE AND METHOD FOR MAKING A FOUR LAYER MAGNETORESISTANCE DEVICE

[75] Inventors: Thomas R. McGuire, Yorktown Heights; Thomas S. Plaskett, Katonah, both of N.Y.

[73] Assignee: International Business Machines Corporation, Armonk, N.Y.

[21] Appl. No.: 973,095

[22] Filed: Nov. 6, 1992

[51] Int. Cl.⁵ .................. G01R 33/02; H01L 43/08; G11C 19/08; G11B 5/39
[52] U.S. Cl. .................. 324/252; 338/32 R; 360/113; 29/603
[58] Field of Search .................. 324/252; 338/32 R; 360/113; 29/25.02, 603

[56] References Cited

U.S. PATENT DOCUMENTS

| | | | |
|---|---|---|---|
| 4,103,315 | 7/1978 | Hempstead et al. | 360/113 |
| 5,014,147 | 5/1991 | Parkin et al. | 360/113 |
| 5,159,513 | 10/1992 | Dieny et al. | 324/252 |
| 5,206,590 | 4/1993 | Dieny et al. | 324/252 |

Primary Examiner—Walter E. Snow
Attorney, Agent, or Firm—Robert M. Trepp; Ronald L. Drumheller

[57] ABSTRACT

A magnetoresistive device is described for detecting magnetic fields incorporating a sandwich structure of four layers, two of which are ferromagnetic and which are separated by a non-ferromagnetic metallic layer and where one ferromagnetic layer is adjacent a fourth antiferromagnetic layer and exhibiting exchange anisotropy with the adjacent ferromagnetic layer. The invention overcomes the problem of small changes in magnetoresistance and in controlling the magnetization response of the magnetoresistive device.

8 Claims, 6 Drawing Sheets

FOUR LAYER MAGNETORESISTANCE DEVICE AND METHOD FOR MAKING A FOUR LAYER MAGNETORESISTANCE DEVICE

CROSS-REFERENCE TO RELATED APPLICATIONS

This application is cross-referenced to Ser. No. 625,343 filed Dec. 11, 1990 entitled, "Magnetoresistive Sensor Based on the Spin Valve Effect" by B. Dieny et al which is directed to a magnetoresistive sensor having a first and second thin film layer of magnetic material with the magnetization direction set so that the magnetization of the first layer of magnetic material is perpendicular to the magnetization of the second layer of magnetic material and wherein the magnetization direction of the second layer of magnetic material is fixed.

This application is further cross-referenced to U.S. Ser. No. 937,620 filed Aug. 28, 1992 by B. Dieny entitled, "Exchange Coupled Multilayer Magnetoresistive Sensor" which is directed to a magnetoresistive sensor having a large magnetoresistive response at low applied magnetic fields. A magnetoresistive sensor is described comprising a first and second thin film layer of ferromagnetic material separated by a thin film layer of non-magnetic material. At least one of the ferromagnetic layers is formed of Fe in which the magnetization orientation is fixed or "pinned" by exchange coupling from an adjacent antiferromagnetic layer formed of FeMn. An additional thin film layer of soft magnetic material such as NiFe is placed between the second layer and the antiferromagnetic layer in order to lower its coercivity and increase the range of field strength over which the pinned layer is saturated.

BACKGROUND OF THE INVENTION

1. Field of the Invention

This invention relates to magnetoresistive devices (MR) for detecting magnetic fields, and more particularly, to a sandwich structure incorporating ferromagnetic and antiferromagnetic layers.

2. Background Art

Large magnetoresistances or change in magnetoresistances are needed for read heads in future high density magnetic storage devices. Current magnetoresistive devices used in read heads of storage devices use Permalloy wherein the magnetoresistance only changes a few percent such as 5% or less. "Giant" magnetoresistances and multilayer structures such as 100 layers where each layer is thin, for example 10 Å, are a possible solution but require large magnetic fields such as 10–20 kOe to get a reduction of 80% in resistivity. The layers may alternate between Co and Cu.

Another magnetoresistive device is the "spin-valve" structure comprising a thin layer of Co, a thin layer of Cu and a thin layer of Co to provide a 10–15% change in resistivity as a function of the applied field. While the structure of the three layers is simple, i.e. Co/Cu/Co, the magnitude of the magnetoresistance is difficult to control.

In U.S. Pat. No. 5,014,147 by S.S.P. Parkin et al. entitled, "Magnetoresistive Sensor with Improved Antiferromagnetic Film", an antiferromagnetic layer is formed in direct contact with the magnetoresistive layer. The antiferromagnetic layer comprises $Fe_{1-x}Mn_x$ where x is within the range from 0.3 to 0.4. The magnetoresistive layer comprises NiFe.

In U.S. Pat. No. 5,159,513 by B. Dieny et al. entitled, "Magnetoresistive Sensor Based on the Spin Valve Effect", a layered structure is described comprising a first and second thin film layer of ferromagnetic material formed on a substrate wherein the first and second thin film layers are separated by a thin film layer of non-magnetic metallic material. At least one of the layers of ferromagnetic material comprises cobalt or cobalt alloys. The magnetization direction of the first layer of ferromagnetic material is substantially perpendicular to the magnetization direction of the second layer of ferromagnetic material at zero applied magnetic field.

In U.S. Pat. No. 4,949,039 which issued on Aug. 14, 1990 to P. Grunberg et al. entitled, "Magnetic Field Sensor with Ferromagnetic Thin Layers having Magnetically Antiparallel Polarized Components", a magnetic-field sensor is described having a first ferromagnetic layer magnetized in a first direction, an intermediate layer of non-ferromagnetic material forming an interface with the first layer, and a second ferromagnetic layer forming an interface with the intermediate layer and magnetically polarized with one magnetization-direction component in a direction opposite to the first direction so that the first and second layers are polarized with one component magnetically antiparallel to the first direction. The intermediate layer is composed of a material which causes a spin dependent electron scattering at the interfaces with the ferromagnetic layers. The intermediate layer has a thickness less than the mean free path length of conductivity electrons in the intermediate layer.

In a publication by G. Binasch et al., Physical Review B., V. 39, p. 4828 (1989) entitled, "Enhanced Magnetoresistance in Layered Magnetic Structure with Antiferromagnetic Interlayer Exchange", a layered magnetic structure was described which yields enhanced magnetoresistance effects by antiparallel alignment of the magnetization.

In a publication by W. H. Meiklejohn and C. P. Bean, Physical Review, V. 105, p. 904 (1957) entitled, "New Magnetic Anisotropy", a new type of anisotropy was discovered and described as exchange anisotropy. The anisotropy is the result of an interaction between the spins of cobalt atoms in a ferromagnetic material and the cobalt ions in a antiferromagnetic cobalt oxide. The material was fine particles of cobalt having a diameter in the range from 100–1000 Å. It had a cobaltous oxide coating. Exchange anisotropy has also been described between Ni and NiO. In a publication by A. E. Berkowitz and J. H. Greiner, J. Appl. Phys., V. 36, 3330 (1965) entitled, "Exchange Anisotropy and Strain Interactions in the Ni-NiO System", the exchange anisotropy coupling and the interaction of the field Ni and NiO spin systems were examined for Ni films on single-crystal NiO substrates. The films of Ni and NiO constitute a ferromagnetic-antiferromagnetic combination.

Exchange anisotropies has also been observed in films of Fe-FeS. The exchange anisotropy was described in a publication by J. H. Greiner, J. Appl. Phys., V. 37, 1474 (1966) entitled, "Exchange Anisotropy Properties in Sulfided Iron Films". A layer of antiferromagnetic FeS of 100 Å on a layer of ferromagnetic Fe of 1000 Å produced a 7 Oe shift of the B-H loop. The exchange interaction between the spins across the interface was considered analogous to that in the Co-CoO system described by W. H. Meiklejohn and C. P. Bean, Phys. Rev. 102, 1413 (1956); 105, 904 (1957).

In a publication by J. H. Greiner, IBM Technical Disclosure Bulletin, V. 8, p. 1420 (1966) entitled, "Films with Shifted B-H Loops", exchange coupling was described between ferromagnetic iron and antiferromagnetic ferous sulfide. Similar properties were also observed in alloy films containing iron such as nickel-iron and cobalt-iron films after subjecting the film to hydrogen sulfide at an elevated temperature to provide a sulfide layer of the alloy.

SUMMARY OF THE INVENTION

An apparatus and method for detecting a magnetic field by sensing changes in the magnetoresistance is described comprising a supporting substrate or carrier such as glass, sapphire, quartz, magnesium oxide, silicon, or gallium arsenide, a first layer of ferromagnetic material formed over the substrate wherein the magnetic material is ferromagnetic and may comprise iron, cobalt, nickel, manganese or alloys thereof, a second layer of metallic material which is non-ferromagnetic formed over the first layer, the second layer may comprise copper or gold, a third layer of ferromagnetic material formed over the second layer, the third layer may likewise by comprised of one of the materials suitable for the first layer, a fourth layer of antiferromagnetic material formed on the third layer, the fourth layer may comprise cobalt oxide, nickel oxide, iron oxide, oxide solutions thereof, iron sulfide or iron manganese, the third and fourth layer exhibiting exchange anisotropy which fixes the direction of magnetization of the third layer, the first and third layers adapted for coupling a source of electrical current thereto whereby the resistivity through the first, second and third layers depend upon the mean-free path of the electrons in the layers.

The invention further provides a sandwich structure comprising a substrate having four layers thereover comprising an antiferromagnetic layer, a ferromagnetic layer, a non-ferromagnetic layer and a ferromagnetic layer. The layers may have thicknesses in the range from 10–200 Å. A layer of copper may be formed over the fourth layer of ferromagnetic material to prevent corrosion of the fourth layer.

The invention further provides a magnetoresistive device having corrosion resistance wherein the fourth layer of a four layer structure comprises an antiferromagnetic material of a transition metal such as iron, nickel, cobalt, and an oxide.

It is an object of the invention to provide a sandwich structure for sensing the magnetic fields wherein the change of magnetoresistance is in the range from 10–15%.

Is a further object of the invention to provide a sandwich structure of a magnetoresistance device for sensing magnetic fields having a ferromagnetic layer and an antiferromagnetic layer adjacent one another and exhibiting exchange anisotropy.

It is a further object of the invention to provide a sandwich structure for sensing magnetic fields utilizing an antiferromagnetic material having a transition temperature $T_N$ above room temperature, 296K.

It is a further object of the invention to provide a sandwich structure comprising two ferromagnetic layers spaced apart by a thin layer in the range from 5–60 Å of a non-ferromagnetic metallic material and an antiferromagnetic layer positioned adjacent to one of the ferromagnetic layers to provide exchange coupling with that ferromagnetic layer to fix the direction of magnetization of that ferromagnetic layer.

BRIEF DESCRIPTION OF THE DRAWINGS

These and other features, objects, and advantages of the present invention will become apparent upon a consideration of the following detailed description of the invention when read in conjunction with the drawing, in which.

DESCRIPTION OF THE PREFERRED EMBODIMENT

Figure 1:
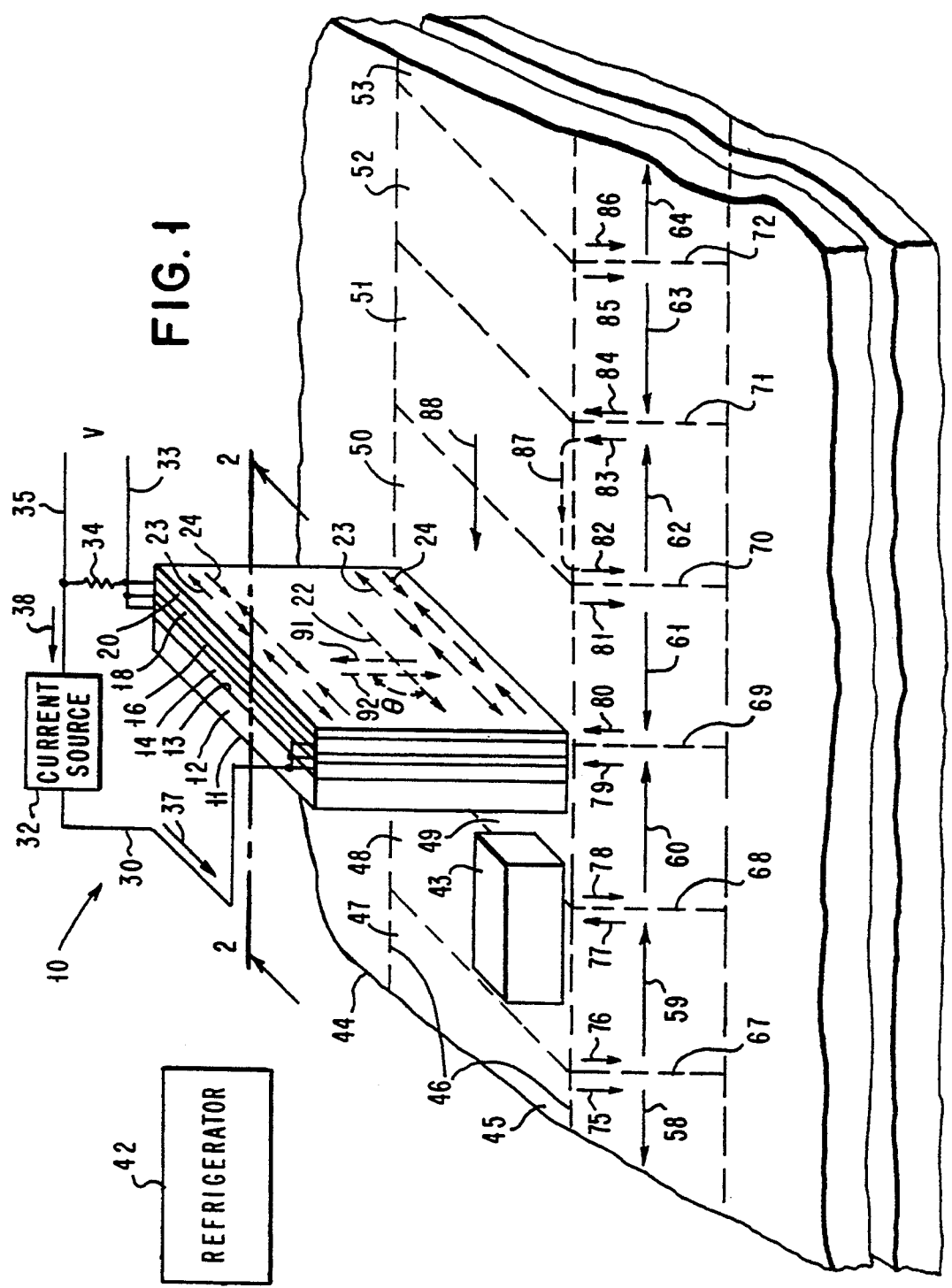
FIG. 1 is one embodiment of the invention.
Figure 2:
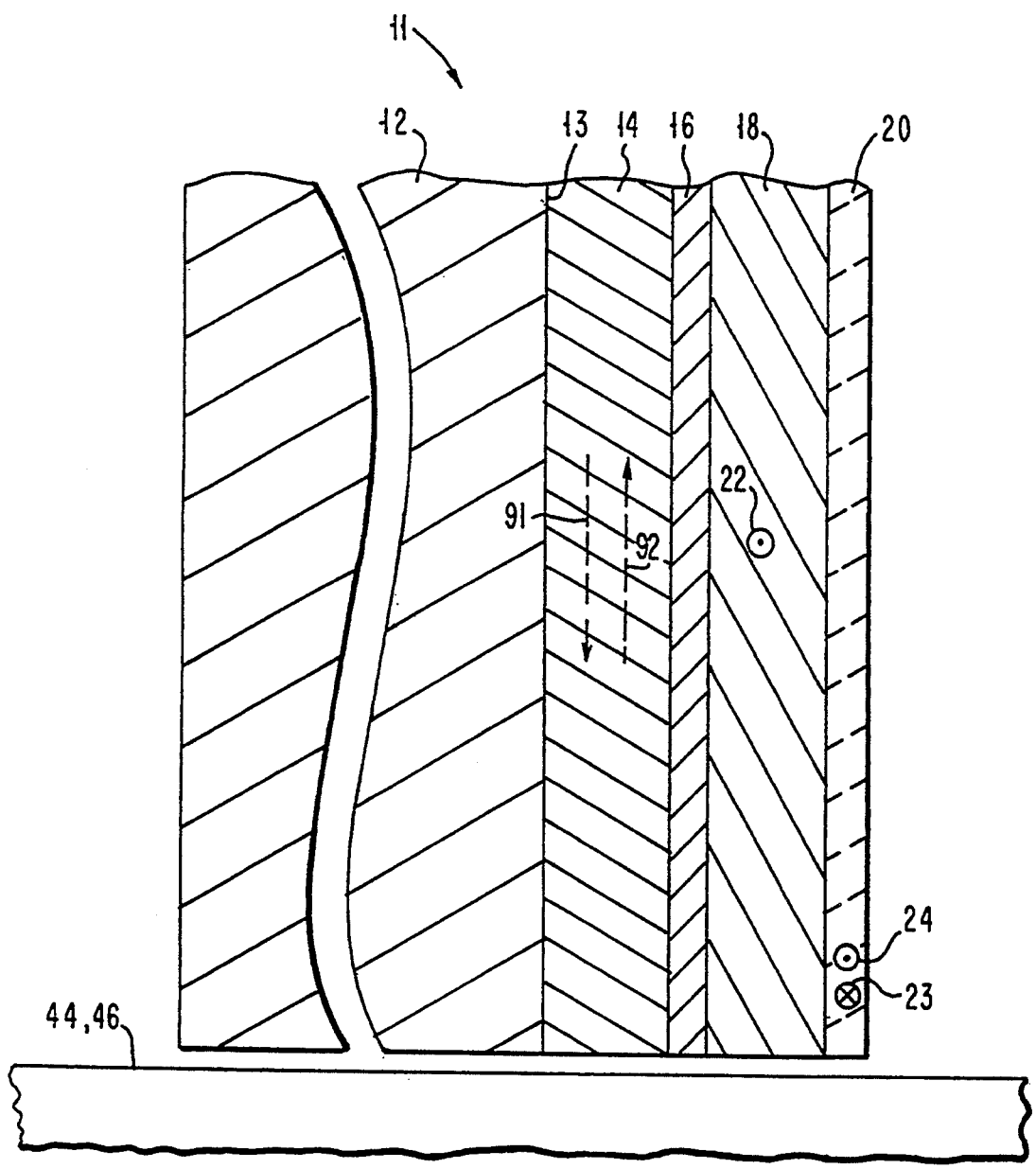
FIG. 2 is a cross-section view along the lines 2-2 of FIG. 1.

Referring now to the drawing, FIG. 1 shows sensor 10 for detecting a magnetic field utilizing magnetoresistance. FIG. 2 is a cross-section view along the lines 2—2 of FIG. 1 to illustrate magnetoresistive device 11. A substrate 12 of magnetoresistive device 11 has a major surface 13 which functions as a support or carrier for subsequent layers. Substrate 12 may be glass, sapphire, quartz, magnesium oxide, silicon, silicon with an insulating layer and gallium arsenide. A first layer 14 of ferromagnetic material is formed on major surface 13. First layer 14 may be selected from the group consisting of iron, cobalt, nickel, manganese, alloys thereof and compounds thereof. A second layer 16 of non-ferromagnetic metallic material is over first layer 14. Second layer 16 may be a metal selected from the group consisting of copper, silver, chromium, titanium, neobium, gold and other conducting metals and alloys. Any metal which will provide a selective election spin scattering or negligible electron spin scattering may be used for a second layer 16. Second layer 16 may have a thickness in the range from 5–60 Å and a thickness in the range from 15–30 Å when layer 16 is copper has been found optimal. A third layer 18 of ferromagnetic material is formed over second layer 16. The material used for third layer 18 may be one of the same materials enumerated as being suitable for layer 14. The thickness of third layer 18 may be in the range from 10–200 Å and preferably in the range from 30–100 Å. A fourth layer 20 of antiferromagnetic material is formed on layer 18. Layer 18 and layer 20 exhibit exchange anisotropy which fixes the direction of magnetization in layer 18 shown in FIGS. 1 and 2 by arrow 22. A supplemental bias field to set the direction and operating point of magnetization in layer 14 may be provided by a bias magnet attached to substrate 12 or in the immediate area. The magnetization in layer 20 which is antiferromagnetic is shown by arrows 23 and 24. Layer 20 may have a thickness in the range from 10–40 Å and may be thicker such as 200 Å and beyond. Layer 20 may be, for example, iron oxide, nickel oxide, cobalt oxide, oxide solutions thereof, iron sulfide, and iron manganese. If cobalt oxide is used, cooling must be provided to cool it below the Ne'el temperature. The transition temperature $T_N$ is the temperature of transition from an antiferromagnetic material to a paramagnetic material at the higher temperature. Refrigerator 42 may be thermally coupled to magnetoresistive device 11 to cool MR device 11 below the Ne'el temperature $T_N$. Nickel oxide would be a particularly desirous antiferromagnetic material because $T_N$ is equal to 523K. While layer 20 has been described as comprising antiferromagnetic material, ferromagnetic material such as $Fe_3O_4$ may be used in its place.

Layers 14 and 18 of ferromagnetic material may be polycrystalline, and preferably face centered cubic and not hexagonal in crystalline structure. It is known that copper which may be used to form layer 16 matches well with face centered cubic cobalt. Ferromagnetic layers 14 and 18 may be textured having an upper surface in the (111) crystalline plane.

One side of ferromagnetic layer 14 or layers 14, 16 and 18 together are coupled over lead 30 to an output of current source 32. The other side of layer 14 or layers 14, 16 and 18 together are coupled to an output over lead 33 and to one side of resistor 34. The other side of resistor 34 is coupled over lead 35 to an output terminal and to a second output terminal of current source 32. Current source 32 may provide electrical current over lead 30 shown by arrow 37 to one side of layers 14, 16 and 18. The current travels back and forth through layer 14, non-ferromagnetic layer 16 and ferromagnetic layer 18. Current flows out of the other side of layers 14, 16 and 18 over lead 33 through resistor 34 and over lead 35 to current source 32 shown by arrow 38. Variations in electrical current from current source 32 appear as a voltage across resistor 34 or leads 33 and 35 to provide a voltage V.

As shown in FIGS. 1 and 2, sensor 10 may be positioned over magnetic media 44 which may be a ferromagnetic material having magnetic domains written therein, for example, by an inductive head 43. Magnetic media 44 may be a portion of a hard disk, floppy disk, or magnetic tape having tracks such as track 46 therein for which sensor 10 is aligned transverse to track 46. Track 46 may have a sequence of magnetic domains 47–53. Magnetic domains 47–53 have a major magnetization direction parallel to surface 45 of magnetic media 44 and longitudinal with track 46 shown by arrows 58–64. Between magnetic domains 47–53 are domain walls 67–72 respectively. Domain walls 67–72 have a vertical magnetic field on either side of the domain wall shown by arrows 75–86. The direction of arrows 75–86 are dependent upon the magnetization direction shown by arrows 58–64.

Magnetic media 44 may move as shown by arrow 88 underneath sensor 10 with sensor 10 very close to surface 45 and aligned with track 46 so as to intercept the magnetic fields vertical with respect to surface 45 at domain walls such as domain walls 67–72 as sensor 10 passes above. The magnetic fields pass through ferromagnetic layer 14 which rotates its magnetization in the plane of layer 14 to correspond to the direction of the magnetic field shown by arrow 79. The magnetization of layer 18 remains fixed due to exchange coupling with antiferromagnetic layer 20. The fixed direction of magnetization of layer 20 is shown by arrow 22. Thus, the magnetization of layer 14 with respect to layer 18 is transverse or perpendicular. A higher resistivity will be observed for current passing from layer 14 to layer 18 due to scattering at layer 16 due to the spins of the electrons in layer 14 and the preferred spins of the electrons in layer 18. The resistivity $\rho$ is dependent on the mean-free path of the electrons passing through layers 14, 16 and 18. Layer 20 of antiferromagnetic material is or may be electrically insulating.

Although the embodiment of this invention is a detector of vertical flux lines as shown in FIG. 1, it is also effective for magnetic flux parallel to the magnetic media surface 45 where such parallel flux lines 87 could orient the magnetization in layer 14 opposite or antiparallel to the magnetization of layer 18. Both layers 14 and 18 are positioned parallel to the magnetic media surface 45. A higher resistivity will also be observed for the antiparallel orientation making this device a sensitive MR detector.

As sensor 10 passes over surface 45 of magnetic media 44 along track 46, layer 14 is influenced by the vertical magnetization such as by arrows 79 and 80 associated with magnetic domains 49 and 50 and causes the magnetization in layer 14 to rotate or align itself with arrow 79 shown by arrow 91. The magnetization direction in layer 18 does not change and remains as shown by arrow 22. As sensor 10 moves along track 46 and is positioned above arrows 81 and 82 of magnetic domains 50 and 51, the magnetization of layer 14 aligns with the magnetic field shown by arrow 80 as shown by arrow 92. The magnetization direction of layer 18 remains unchanged as shown by arrow 22. The magnetoresistance of sensor 10 is a function of the angle $\theta$ formed between the magnetization direction of layer 18 shown by arrow 22 and the direction of magnetization of layer 14 shown, for example, by arrow 91 or arrow 92. The maximum magnetoresistance occurs when the magnetization directions are antiparallel or 180°. The magnetization is a function of $\sin(\theta,/2)$ where $\theta$ is the angle between the magnetization directions of layer 14 and layer 18.

Figure 3:
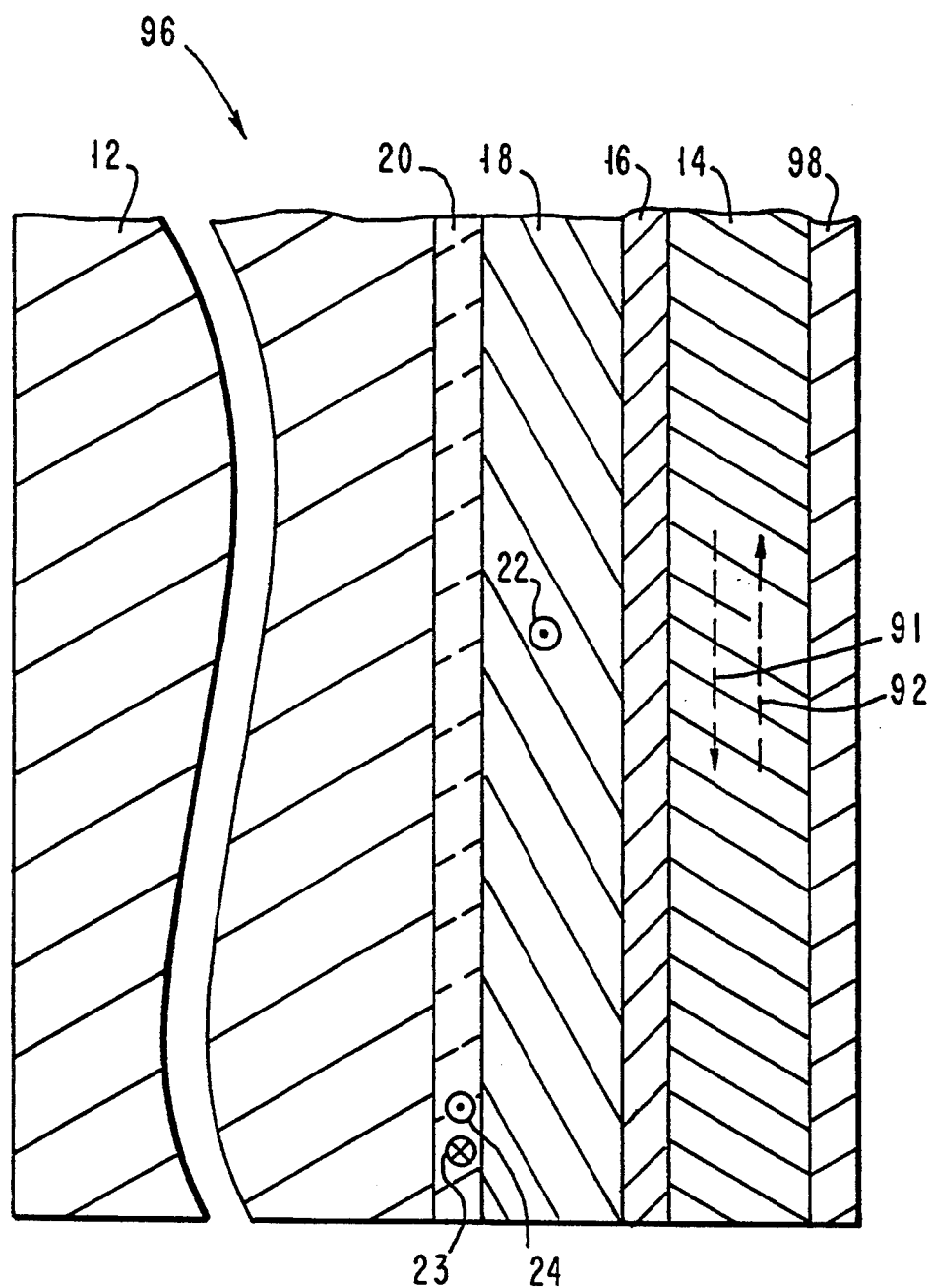
FIG. 3 is an alternate embodiment of the invention.

FIG. 3 shows a cross-section view of magnetoresistance (MR) device 96. MR device 96 may be substituted in place of MR device 11 shown in FIG. 1 for operation of sensor 10. In FIG. 3, like references are used for functions corresponding to the apparatus of FIGS. 1 and 2. In FIG. 3, the order or sequence of layer above substrate 12 have been reversed so that antiferromagnetic layer 20 is adjacent substrate 12. Ferromagnetic layer 18 is formed over antiferromagnetic layer 20 and exhibits exchange anisotropy with layer 20 having a magnetization which is fixed in layer 18 shown by arrow 22. A layer of non-ferromagnetic material 16 is formed over layer 18. Layer 14 of ferromagnetic material is formed over non-ferromagnetic layer 16. Arrows 91 and 92 shown in FIG. 2 correspond to arrows 91 and 92 shown in FIG. 1 representing at different times the magnetization in layer 14 as it is subject to a magnetic field from magnetic media 44 shown by arrows 79 and 80 with respect to magnetic domains 49 and 50. Layer 98 is formed over layer 14 and may be, for example, copper and functions to provide a protective layer over ferromagnetic layer 14 to prevent corrosion of ferromagnetic layer 14. MR device 96 functions in the same manner as MR device 11. MR device 11, at times layer 20 is an oxide, provides an inherent protective coating over ferromagnetic layer 18 to prevent corrosion of ferromagnetic layer 18.

The magnetoresistive device 11 shown in FIGS. 1 and 2 was prepared by magnetron sputtering with two targets. Antiferromagnetic layer 20 was formed by adding 10% oxygen to the normal argon atmosphere for a 10-50 Å CoO layer directly on top of the Co layer 18. It could be deposited directly from a CoO target in Ar. The oxide layer could be formed by oxidizing a Co deposited layer. Ferromagnetic layer 14 was formed of cobalt and had a thickness of 50 Å. Non-ferromagnetic layer 16 was formed of copper and had a thickness of 28 Å. Ferromagnetic layer 18 was formed of cobalt and had a thickness of 50 Å. Antiferromagnetic layer 20 was formed of cobalt oxide and had a thickness of 41 Å.

Figure 4:
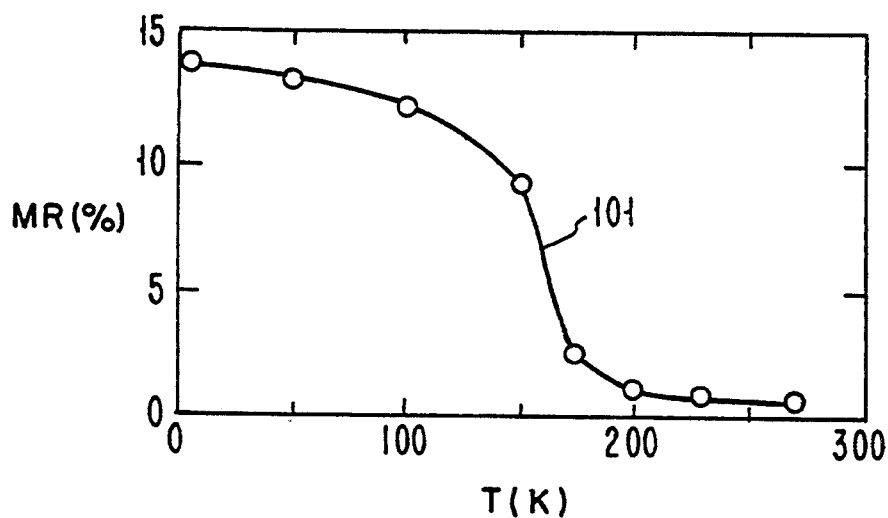
FIG. 4 is a graph of the magnetoresistance change versus temperature.

FIG. 4 is a graph of the magnetoresistance change versus temperature T(K). Curve 101 in FIG. 4 shows that the magnetoresistance at 0(K) has a maximum of 14% change and goes to 0 at about 180(K) close to the Ne'el temperature for CoO. In FIG. 4, the ordinate represents change in magnetoresistance in percent and the abscissa represents temperature in Kelvin.

Figure 5:
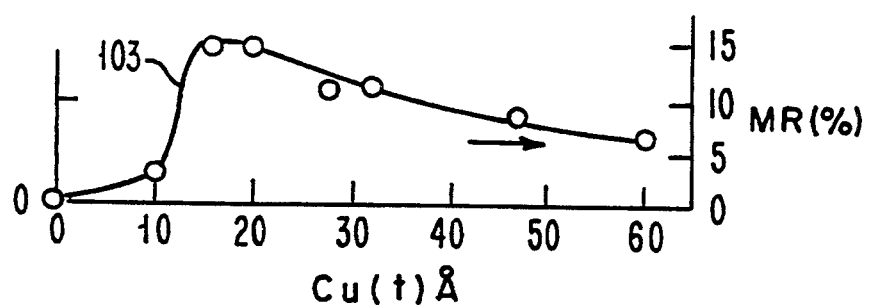
FIG. 5 is a graph of the magnetoresistance change versus thickness of layer 16 of copper.

FIG. 5 is a graph of the change in magnetoresistance versus thickness of copper in layer 16 of the structure shown in FIGS. 1 and 2. In FIG. 5, the ordinate represents magnetoresistance change and the abscissa represents thickness in Angstroms. The thickness of the other layers 14, 18 and 20 were the same as described for above for FIGS. 1 and 2. Curve 103 shows a large magnetoresistance change where the thickness of layer 16 is in the range from 16-20 Å and comprises copper. Curve 103 shows that further increases in the thickness of layer 16 from 20-60 Å causes a gradual decrease in the change of magnetoresistance from 14-6%. Further, curve 103 shows a sharp decrease in the change of magnetoresistance for thickness of layer 16 of copper when less than 20 Å which emphasizes the importance of the copper layer.

Figure 6:
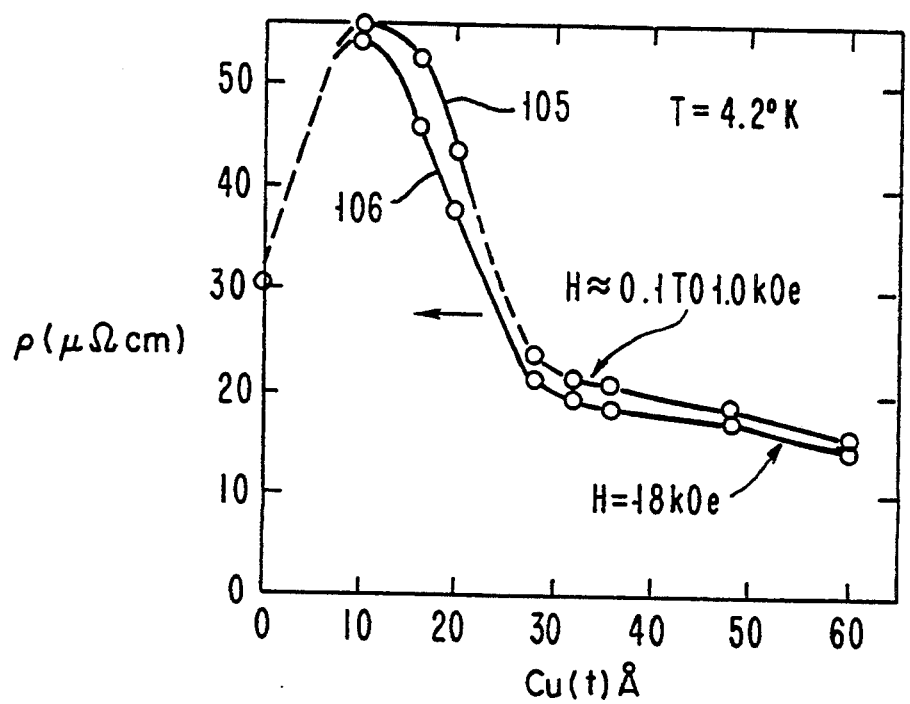
FIG. 6 is a graph of the resistivity at various value of H versus thickness of copper in layer 16 of copper.

FIG. 6 is a graph of the resistivity versus thickness of layer 16 of copper. In FIG. 6, the ordinate represents resistivity in micro ohm centimeters and the abscissa represents thickness in Angstroms. The magnetoresistance device 11 corresponds to the measurements made in FIGS. 5 and 6 with layer 14 being 50 Å of cobalt, layer 16 being copper and varied from 0-60 Å as shown in FIGS. 5 and 6. Layer 18 being 50 Å of cobalt and layer 20 being 41 Å of cobalt oxide. Curve 105 shows the resistivity as a function of thickness of layer 16 per a magnetic field H between 0.1-1.0 kOe. Curve 106 shows the resistivity as a function of the thickness of copper layer 16 for an applied magnetic field at 18 kOe. The temperature of magnetoresistance device 11 at the time the measurements were made was 4.2K. The high resistivity along with the large magnetoresistance change in the MR device with a copper layer 16 having a thickness in the range from 16-20 Å was unexpected.

Figure 7:
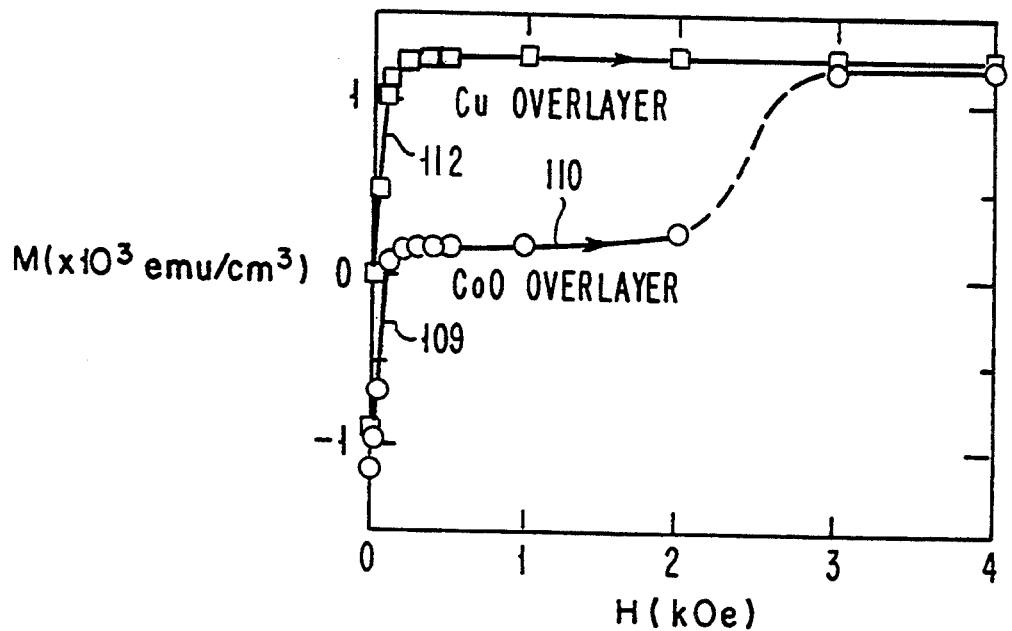
FIG. 7 is a graph of the magnetization in emu/cm$^3$ versus applied H in kOe.

FIG. 7 is a graph of the magnetization in emu/cm$^3$ versus the applied H in kOe. In FIG. 7, the ordinate represents magnetization and the abscissa represents applied field H. Curve 109 shows the magnetic response for magnetoresistance device 11 where layers 14 and 18 are 50 Å thick of cobalt and layer 16 is 28 Å thick of copper. Layer 20 is 41 Å thick of cobalt oxide. Curve 109 shows the magnetization as a function of applied field H having a magnetization plateau shown by curve portion 110. A magnetoresistance device different from magnetoresistance device 11 was made by replacing cobalt oxide layer 20 with copper. Curve 112 shows the response of the magnetoresistance device with 20 Å of copper replacing layer 20 of cobalt oxide. Curve 112 shows that with the protective copper overlayer, the magnetization plateau shown by curve portion 110 is eliminated which indicates that exchange coupling between ferromagnetic layers 14 and 18 of cobalt is small.

Figure 8:
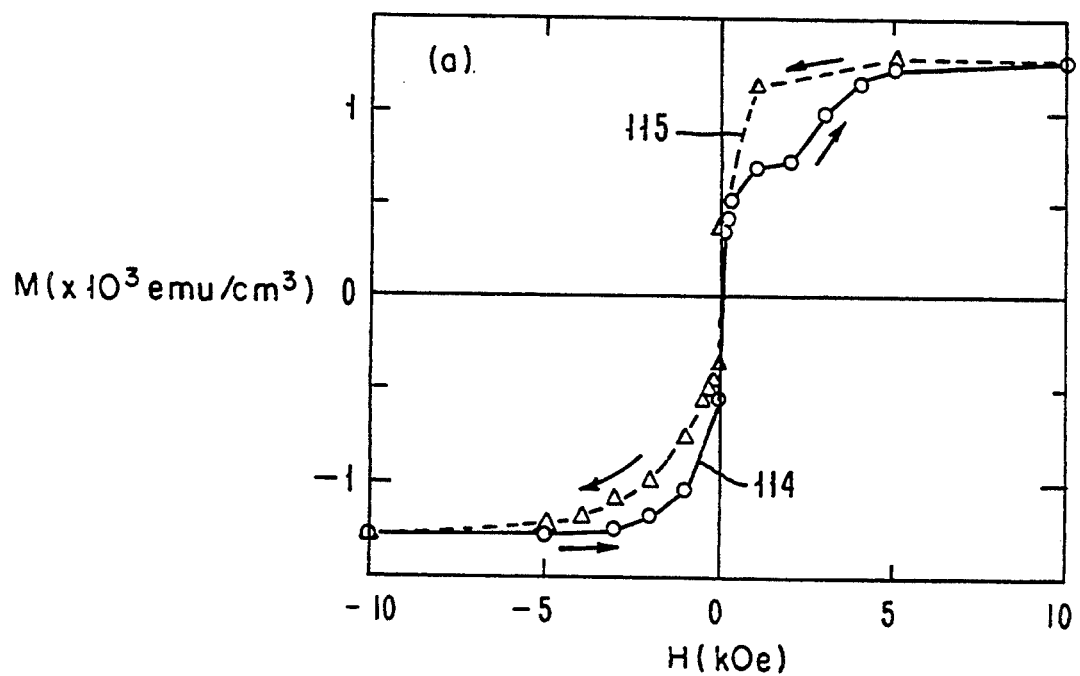
FIG. 8 is a graph of the magnetization versus applied field H which shows Hysteresis' effects.
Figure 9:
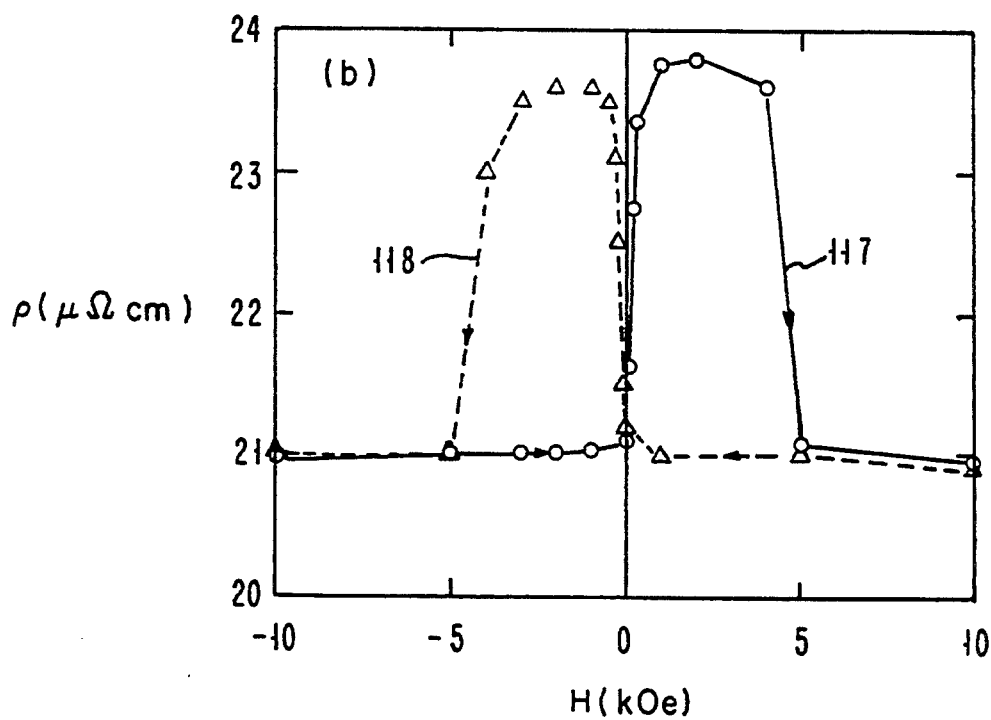
FIG. 9 is a graph of the magnetoresistance versus applied field H which also shows large Hysteresis.

FIG. 8 is a graph of the magnetization versus applied field and FIG. 9 is a graph of the magnetoresistance versus applied field. In FIG. 8, the ordinate represents magnetization in emu/cm$^3$ and the abscissa represents applied field in kOe. In FIG. 9, the ordinate represents resistivity in micro ohms centimeter and the abscissa represents applied field in kOe. The data was taken with a magnetoresistance device 11 having layer thicknesses as the same as described for FIG. 4. Curve 114 shows the change of magnetization where the applied field goes from $-10$ to $+10$ kOe. Curve 115 shows the magnetization where the applied field goes from $+10$ to $-10$ kOe. Curve 117 in FIG. 9 shows the resistivity where the applied field goes from $-10$ to $+10$ kOe. Curve 118 shows the resistivity where the applied field goes from $+10$ to $-10$ kOe.

While there has been described and illustrated a sensor and magnetorestrictive device for detecting magnetic fields, it will be apparent to those skilled in the art that modifications and variations are possible without deviating from the broad scope of the invention which shall be limited solely by the scope of the claims appended hereto.

Having thus described my invention, what I claim as new and desire to secure by Letters Patent is:

1. An apparatus for detecting a magnetic field comprising:

a substrate having a major surface, a first layer of ferromagnetic material formed on said major surface, a second layer of metallic non-ferromagnetic material formed on said first layer, a third layer of ferromagnetic material formed on said second layer, a fourth layer of antiferromagnetic material formed on said third layer, said third and fourth layers exhibiting exchange anisotropy which fixes the direction of magnetization, said first, second and third layers adapted for coupling to a source of electrical current whereby the resistivity through said first, second and third layers depends upon the mean-free path of the electrons in said layers, and means for cooling said first through fourth layers below a predetermined temperature.

2. The apparatus of claim 1 wherein said temperature is the Néel temperature $T_N$.

3. An apparatus for detecting a magnetic field comprising:

a substrate having a major surface, a first layer of ferromagnetic material formed on said major surface, a second layer of metallic non-ferromagnetic material formed on said first layer, a third layer of ferromagnetic material formed on said second layer, a fourth layer of antiferromagnetic material formed on said third layer, said third and fourth layers exhibiting exchange anisotropy which fixes the direction of magnetization, said first, second and third layers adapted for coupling to a source of electrical current whereby the resistivity through said first, second and third layers depends upon the mean-free path of the electrons in said layers, and a source of electrical current coupled to said first and third layer.

4. The apparatus of claim 3 further including a resistance in series with said source of electrical current to provide a voltage there across indicative of the resistivity of said first through third layers.

5. A method for making a magnetoresistive device comprising the steps of:
selecting a substrate having a major surface,
forming a first layer of ferromagnetic material on said major surface,
forming a second layer of metallic non-ferromagnetic material on said first layer,
forming a third layer of ferromagnetic material on said second layer,
forming a fourth layer of antiferromagnetic material on said third layer, said third and fourth layers exhibiting exchange anisotropy which fixes the direction of magnetization, said first, second and third layers adapted for coupling to a source of electrical current whereby the resistivity through said first, second and third layers depends upon the mean-free path of the electrons in said layers, and
cooling said first through fourth layers below a predetermined temperature.

6. The method of claim 5 wherein the step of cooling includes cooling below the Ne'el temperature $T_N$.

7. A method for making a magnetoresistive device comprising the steps of:
selecting a substrate having a major surface,
forming a first layer of ferromagnetic material on said major surface,
forming a second layer of metallic non-ferromagnetic material on said first layer,
forming a third layer of ferromagnetic material on said second layer,
forming a fourth layer of antiferromagnetic material on said third layer, said third and fourth layers exhibiting exchange anisotropy which fixes the direction of magnetization, said first, second and third layers adapted for coupling to a source of electrical current whereby the resistivity through said first, second and third layers depends upon the mean-free path of the electrons in said layers, and
coupling a source of electrical current to said first and third layer.

8. The method of claim 7 further including the step of inserting a resistance in series with said source of electrical current to provide a voltage there across indicative of the resistivity of said first through third layers.

* * * * *